US010832947B2

(12) United States Patent
Park et al.

(10) Patent No.: US 10,832,947 B2
(45) Date of Patent: Nov. 10, 2020

(54) FULLY ALIGNED VIA FORMATION WITHOUT METAL RECESSING

(71) Applicant: INTERNATIONAL BUSINESS MACHINES CORPORATION, Armonk, NY (US)

(72) Inventors: Chanro Park, Clifton Park, NY (US); Ruilong Xie, Niskayuna, NY (US); Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/288,858

(22) Filed: Feb. 28, 2019

(65) Prior Publication Data
US 2020/0279769 A1  Sep. 3, 2020

(51) Int. Cl.
*H01L 21/768*  (2006.01)
*H01L 23/522*  (2006.01)
*H01L 21/311*  (2006.01)

(52) U.S. Cl.
CPC .. *H01L 21/76816* (2013.01); *H01L 21/76832* (2013.01); *H01L 21/76834* (2013.01); *H01L 21/76897* (2013.01); *H01L 23/5226* (2013.01); *H01L 21/31122* (2013.01)

(58) Field of Classification Search
CPC ......... H01L 21/76816; H01L 21/76897; H01L 23/5226; H01L 21/76834; H01L 21/76832; H01L 21/31122
See application file for complete search history.

(56) References Cited

U.S. PATENT DOCUMENTS

| 5,888,897 A | 3/1999 | Liang |
| 6,465,343 B1 * | 10/2002 | Wang ................ H01L 21/31144 257/E21.257 |
| 9,059,257 B2 | 6/2015 | Li et al. |

(Continued)

FOREIGN PATENT DOCUMENTS

| WO | 2018101961 A1 | 6/2018 |
| WO | 2018118089 A1 | 6/2018 |
| WO | 2018118090 A1 | 6/2018 |

OTHER PUBLICATIONS

Briggs et al., "Fully Aligned Via Integration for Extendibility of Interconnects to Beyond the 7 nm Node", IEEE International Electron Devices Meeting. Dec. 2, 2017. pp. 1-4.

(Continued)

*Primary Examiner* — Syed I Gheyas
(74) *Attorney, Agent, or Firm* — Tutunjian & Bitetto, P.C.; Randall Bluestone

(57) ABSTRACT

A method is presented for forming fully aligned vias without recessing a plurality of conductive lines. The method includes forming the plurality of conductive lines within an interlayer dielectric (ILD), growing first dielectric regions in direct contact with the plurality of conductive lines, forming a capping layer over the first dielectric regions, depositing an ultra-low-k (ULK) layer over and in direct contact with the capping layer, forming a via over a conductive line of the plurality of conductive lines, and removing an exposed portion of the capping layer and an exposed first dielectric region in direct contact with the conductive line to reveal the conductive line.

20 Claims, 10 Drawing Sheets

(56) References Cited

U.S. PATENT DOCUMENTS

| | | |
|---|---|---|
| 9,324,650 B2 | 4/2016 | Edelstein et al. |
| 9,373,582 B1 | 6/2016 | Feurprier et al. |
| 9,607,893 B1 | 3/2017 | Zhang et al. |
| 9,793,156 B1 | 10/2017 | Yang |
| 9,953,865 B1 | 4/2018 | Briggs et al. |
| 2006/0113672 A1* | 6/2006 | Wang ............... H01L 21/76801 257/760 |
| 2013/0328208 A1* | 12/2013 | Holmes ............. H01L 21/76883 257/774 |
| 2014/0151893 A1 | 6/2014 | Boyanov et al. |
| 2016/0163587 A1 | 6/2016 | Backes et al. |
| 2016/0190009 A1 | 6/2016 | Wallace et al. |
| 2016/0358812 A1 | 12/2016 | Murray et al. |
| 2018/0040510 A1 | 2/2018 | Briggs et al. |

OTHER PUBLICATIONS

Anonymous, "A Structure and Method for bi-directionally self aligned vias (bSAV)", IP.com. An IP.com Prior Art Database Technical Disclosure. IP.com No. IPCOM000201787D. Nov. 23, 2010. pp. 1-4.

Anonymous, "bi-directional self aligned vias", IP.com. An IP.com Prior Art Database Technical Disclosure. IP.com No. IPCOM000231097D. Sep. 26, 2013. pp. 1-6.

Murdoch et al., "Feasibility Study of Fully Self Aligned Vias for 5nm Node BEOL", 2017 IEEE Interconnect Technology Conference. May 16, 2017. pp. 1-4.

* cited by examiner

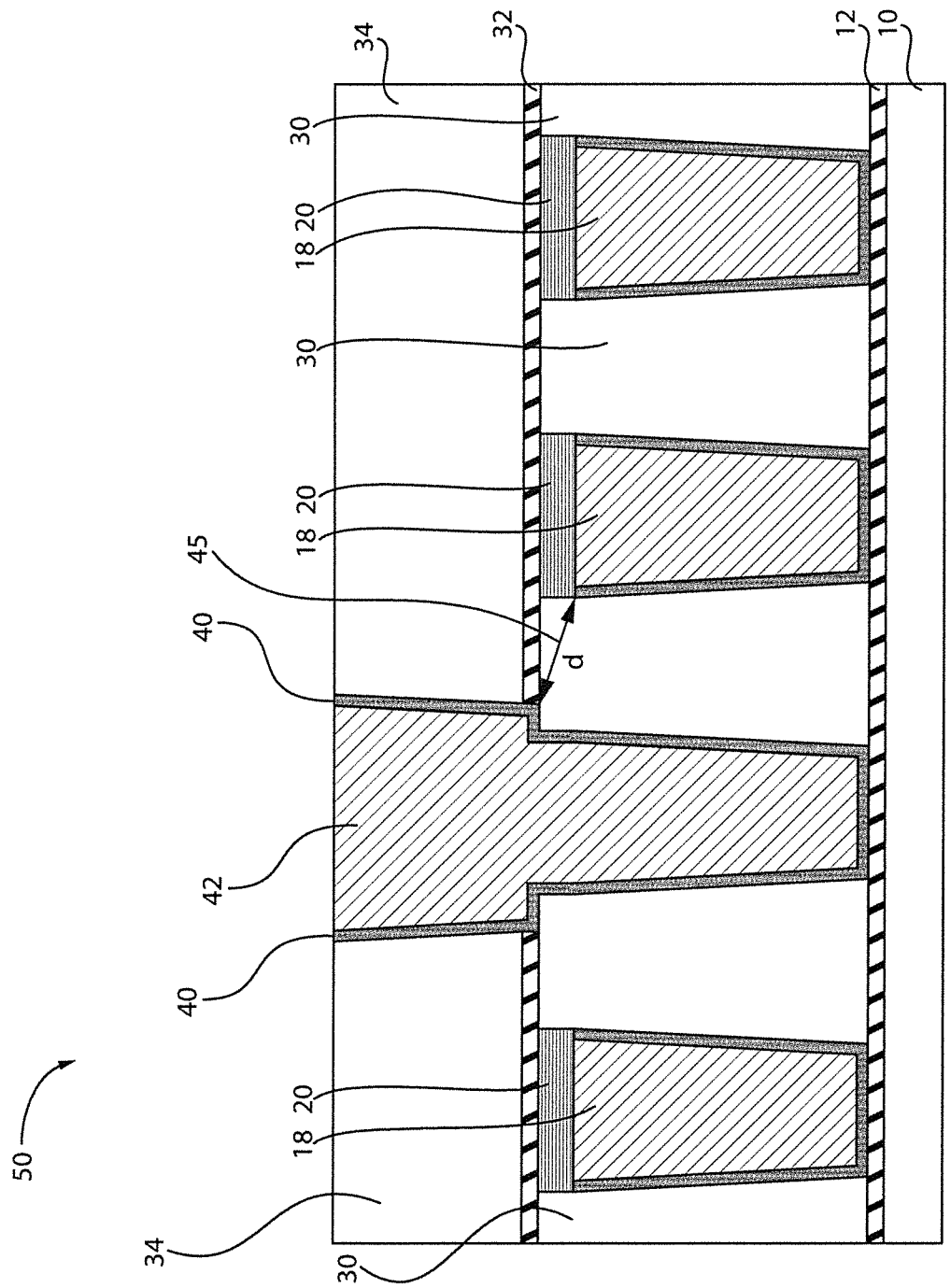

FULLY ALIGNED VIA FORMATION WITHOUT METAL RECESSING

BACKGROUND

The present invention relates generally to semiconductor devices, and more specifically, to fully aligned via formation without metal line recessing.

As process dimensions continue to shrink, litho-etch patterning for semiconductor devices is usually needed to print 64 nanometer (nm) pitch metal layers (Mx levels) or below. However, poor overlay can be a significant factor for consideration in successful patterning applications. For example, without self-aligned via (SAV) processes, the dielectric space between copper lines and vias can become small, which can cause reliability issues.

SUMMARY

In accordance with an embodiment, a method is provided for forming fully aligned vias without recessing a plurality of conductive lines. The method includes forming the plurality of conductive lines within an interlayer dielectric (ILD), growing first dielectric regions in direct contact with the plurality of conductive lines, forming a capping layer over the first dielectric regions, depositing an ultra-low-k (ULK) layer over and in direct contact with the capping layer, forming a via over a conductive line of the plurality of conductive lines, and removing an exposed portion of the capping layer and an exposed first dielectric region in direct contact with the conductive line to reveal the conductive line.

In accordance with another embodiment, a method is provided for forming fully aligned vias without recessing a plurality of conductive lines. The method includes depositing aluminum nitride (AlN) on the plurality of Cu lines, depositing aluminum oxynitride (AlNO) on inter-layer dielectric (ILD) surfaces of a Cu damascene line structure, removing the AlON selective to the AlN to form AlN capped Cu lines, coating and planarizing a first ultra-low-k (ULK) ILD layer, depositing a capping layer and a second ULK ILD layer, patterning a via in the second ULK ILD layer, etching through the capping layer, and selectively removing an exposed AlN resulting in a via bottom opening fully aligned and confined on the Cu line below.

In accordance with yet another embodiment, a semiconductor device is provided for forming fully aligned vias without recessing a plurality of conductive lines. The semiconductor device includes the plurality of conductive lines disposed within an interlayer dielectric (ILD), first dielectric regions disposed in direct contact with the plurality of conductive lines, a capping layer in direct contact with the first dielectric regions, an ultra-low-k (ULK) layer disposed over and in direct contact with the capping layer, a via disposed over a conductive line of the plurality of conductive lines, the via formed without recessing the conductive line, and a conductive material disposed within the via.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein:

FIG. 10 is a cross-sectional view of the semiconductor structure of FIG. 9 where a metal fill takes place, the metal fill being planarized, in accordance with an embodiment of the present invention.

Throughout the drawings, same or similar reference numerals represent the same or similar elements.

DETAILED DESCRIPTION

Figure 1:
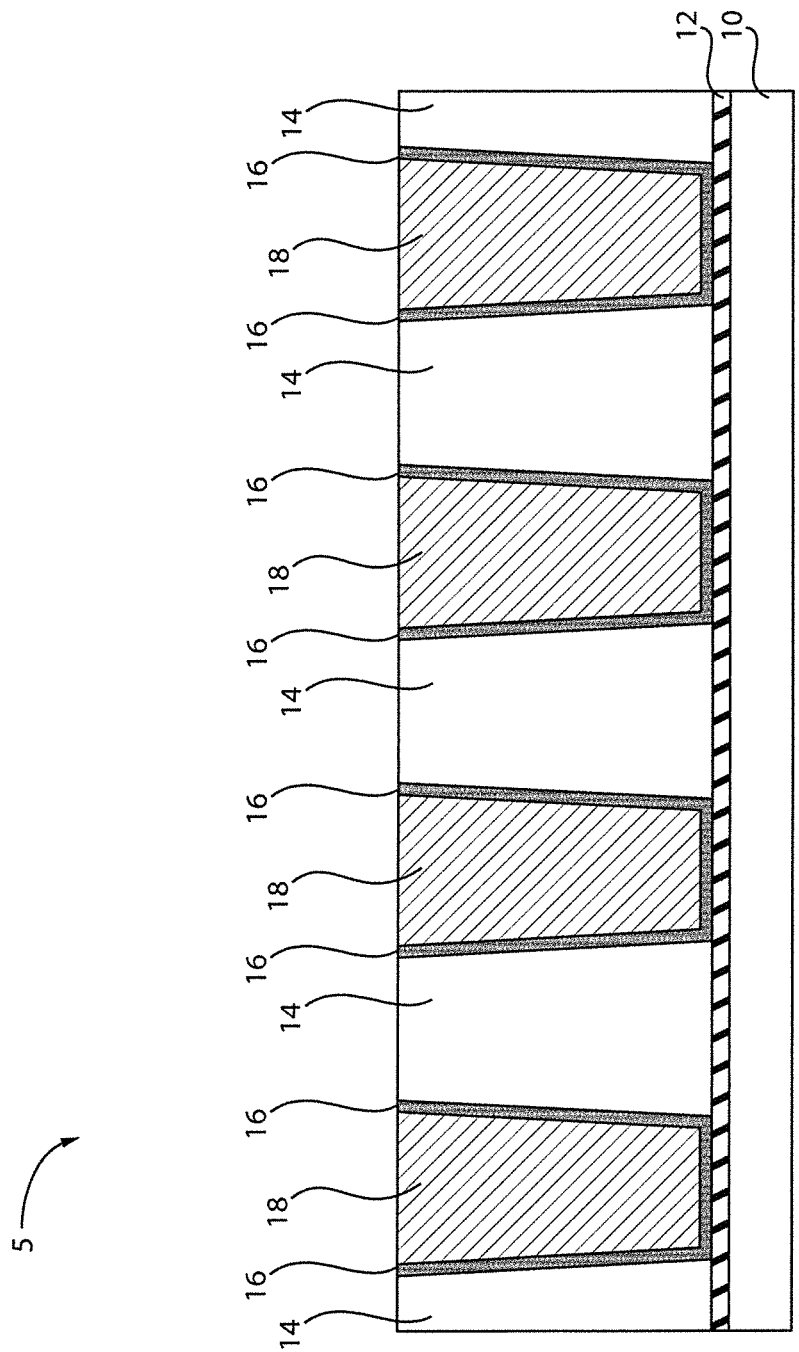
FIG. 1 is a cross-sectional view of a semiconductor structure including a plurality of conductive lines formed within a dielectric layer, in accordance with an embodiment of the present invention.

Embodiments in accordance with the present invention provide methods and devices for constructing fully-aligned vias (FAVs) for low capacitance wiring in semiconductor devices. The FAVs are formed by selective metal deposition techniques. With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step.

Embodiments in accordance with the present invention provide methods and devices for constructing a fully aligned via (FAV) without implementing a conductive line or metal recess. The conductive lines can be, e.g., copper (Cu) lines. FAV schemes have conventionally been implemented by recessing underlying Cu metal lines. A too shallow recess does not fully take advantage of the FAV schemes and a too deep recess causes a line resistance increase. Thus, a Cu recess causes an increase in line resistance. In the exemplary embodiments of the present invention, instead of a copper recess, a selective area deposition of aluminum nitride (AlN) on copper is performed that provides for better uniformity control. AlN acts as a placeholder for the FAV by allowing selective etching. The selective area deposition of AlN on Cu does not increase or does not affect the line resistance. Stated differently, there is no negative impact on line resistance and a uniformly controlled metal recess depth can be achieved.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of conductive lines formed within a dielectric layer, in accordance with an embodiment of the present invention.

A semiconductor structure 5 includes a plurality of conductive lines 18 formed within trenches of an inter-layer dielectric (ILD) 14. The ILD 14 can be formed over cap or capping layer 12, which in turn is formed over substrate 10. A conductive fill material or liner 16 can be formed or deposited around each of the trenches. In one example, the liner can be a tantalum nitride (TaN) liner 16 or in the alternative a tantalum (Ta) liner 16. In one example embodiment, the conductive fill material 16 can be deposited, for example, by electroplating, electroless plating, chemical vapor deposition (CVD), atomic layer deposition (ALD) and/or physical vapor deposition (PVD).

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The cap layer 12 can be deposited using a suitable deposition technique, such as, for example, CVD, PECVD, RFCVD, PVD, ALD, MBD, PLD, and/or LSMCD, sputtering, and/or plating. The cap layer 12 can include a dielectric material, such as, for example, silicon nitride (SiN), silicon carbide (SiC), silicon carbonitride (SiCN), hydrogenated silicon carbide (SiCH), or other suitable material. The cap layer 12 can have a vertical thickness ranging from about 1 nm to about 30 nm. The cap layer 12 can be referred to as an nBLoK layer, where nBLoK is a trademark of Applied Materials, Inc.).

The ILD 14 can include any materials known in the art, such as, for example, porous silicates, carbon doped oxides, silicon dioxides, silicon nitrides, silicon oxynitrides, or other dielectric materials. The ILD 14 can be formed using any method known in the art, such as, for example, chemical vapor deposition, plasma enhanced chemical vapor deposition, atomic layer deposition, or physical vapor deposition. The ILD 14 can have a thickness ranging from about 25 nm to about 200 nm.

The dielectric material of layer 14 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 18 can be formed in the openings or trenches formed in the ILD 14. The metal lines 18 can be any conductive materials known in the art, such as, for example, copper (Cu), aluminum (Al), or tungsten (W). The metal lines 18 can be fabricated using any technique known in the art, such as, for example, a single or dual damascene technique. In an embodiment, not illustrated, the metal lines 18 can be copper (Cu) and can include a metal liner 16, where the metal liner 18 can be metals, such as, for example, tantalum nitride and tantalum (TaN/Ta), titanium, titanium nitride, cobalt, ruthenium, and manganese.

Figure 2:
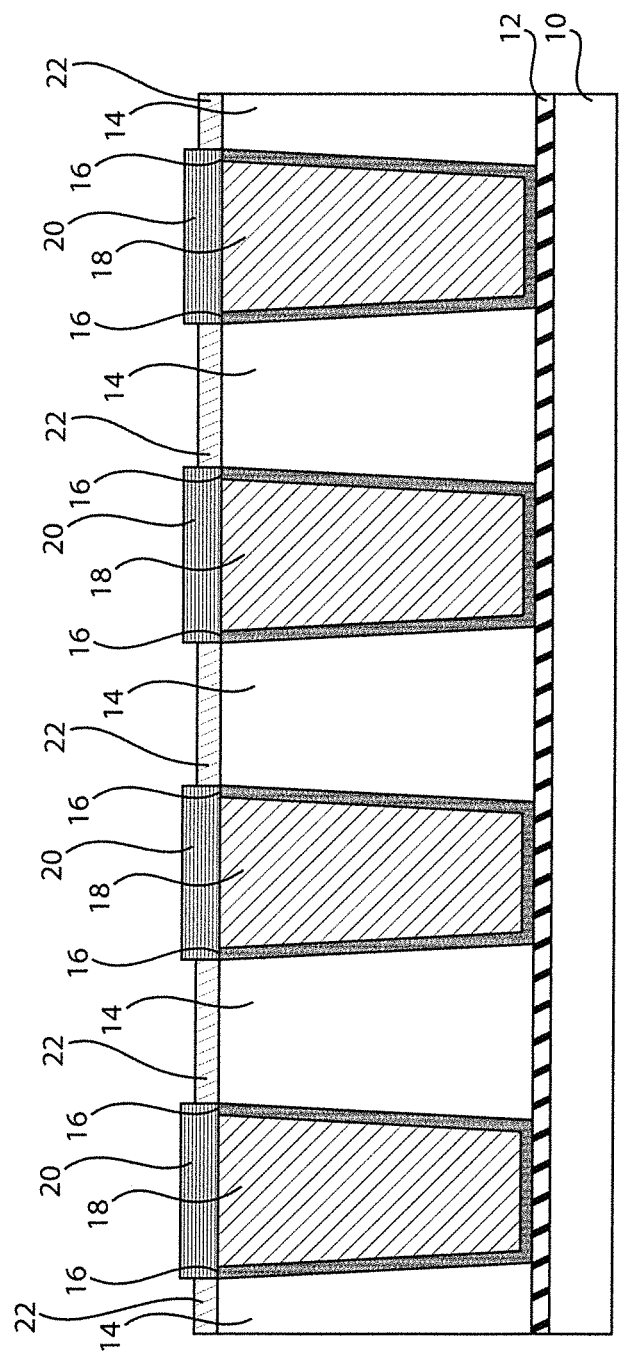
FIG. 2 is a cross-sectional view of the semiconductor structure of FIG. 1 where a first insulating layer is grown over the conductive lines and a second insulating layer is grown over the dielectric layer, in accordance with an embodiment of the present invention.

FIG. 2 is a cross-sectional view of the semiconductor structure of FIG. 1 where a first insulating layer is grown over the conductive lines and a second insulating layer is grown over the dielectric layer, in accordance with an embodiment of the present invention.

In various example embodiments, a first insulating layer 20 is selectively grown over the conductive lines 18 and a second insulating layer 22 is selectively grown over the dielectric layer 14. The first insulating layer 20 can be, e.g., aluminum nitride (AlN) and the second insulating layer 22 can be, e.g., aluminum oxynitride (AlNO). The AlN deposition rate is high over the conductive lines 18, whereas the AlNO can be removed faster than AlN by using hydrogen fluoride (HF). A height of the first dielectric regions 20 is greater than a height of the second dielectric regions 22.

As a result, the conductive lines 18 are not recessed. Instead, selective area deposition of AlN areas 20 on the conductive lines 18 takes place for better uniformity control. This has no negative impact on line resistance.

Figure 3:
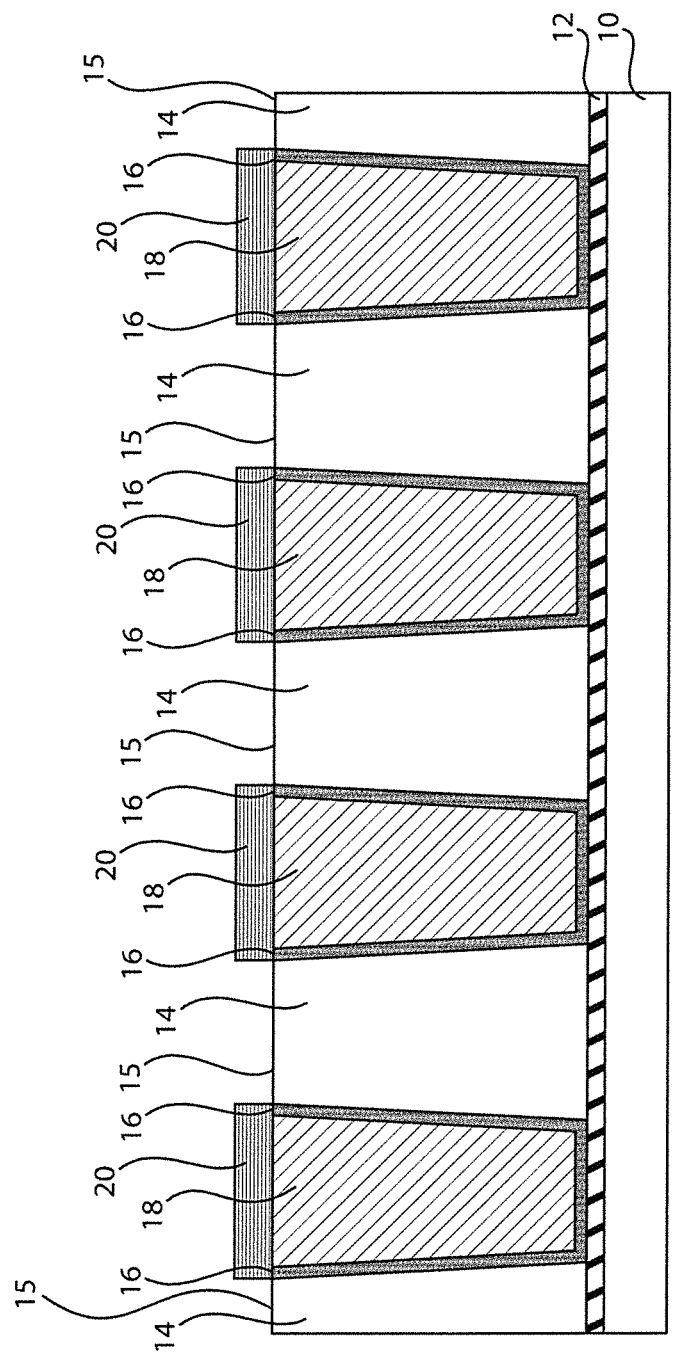
FIG. 3 is a cross-sectional view of the semiconductor structure of FIG. 2 where, optionally, the second insulating layer can be removed, in accordance with an embodiment of the present invention.

FIG. 3 is a cross-sectional view of the semiconductor structure of FIG. 2 where, optionally, the second insulating layer can be removed, in accordance with an embodiment of the present invention.

In various example embodiments, the second insulating layer 22 can be removed. In one embodiment, the second insulating layer 22 can be removed by using a dry etch. Removal of the second insulating layer 22 results in exposure of the top surface 15 of the dielectric layer 14.

Figure 4:
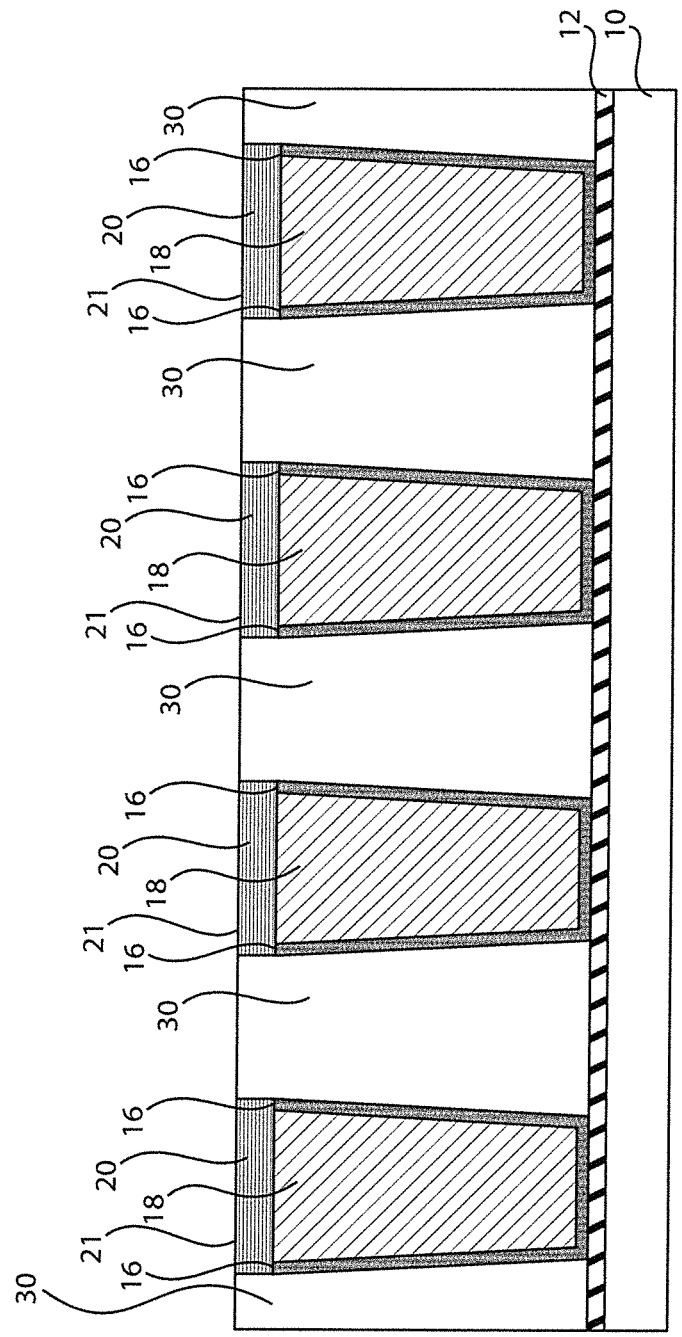
FIG. 4 is a cross-sectional view of the semiconductor structure of FIG. 3 where an ultra-low-k (ULK) material is deposited and chemical-mechanical polishing (CMP) is performed, in accordance with an embodiment of the present invention.

FIG. 4 is a cross-sectional view of the semiconductor structure of FIG. 3 where an ultra-low-k (ULK) material is deposited and chemical-mechanical polishing (CMP) is performed, in accordance with an embodiment of the present invention.

In various example embodiments, a ULK material 30 is deposited. A height of the AlN regions 20 is approximately equal to a height of the ULK material 30.

The ULK material 30 can be, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

In some embodiments, the ULK 30 material can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

In various example embodiments, the height of the ULK material 30 can be reduced by chemical-mechanical polishing (CMP) and/or etching. Therefore, the planarization process can be provided by CMP. Other planarization process can include grinding and polishing. The CMP results in exposure of the top surface 21 of the first insulating layer 20.

Figure 5:
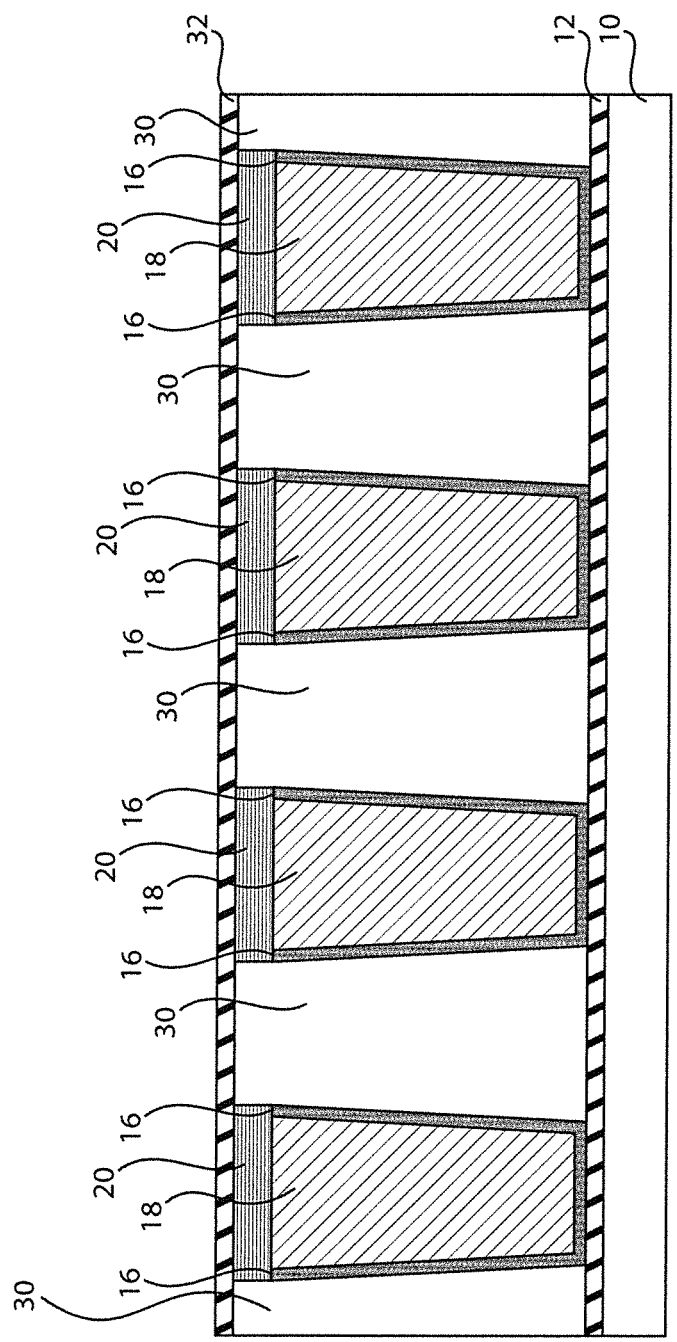
FIG. 5 is a cross-sectional view of the semiconductor structure of FIG. 4 where an nBLOK cap layer is deposited, in accordance with an embodiment of the present invention.

FIG. 5 is a cross-sectional view of the semiconductor structure of FIG. 4 where an nBLOK cap layer is deposited, in accordance with an embodiment of the present invention.

In various example embodiments, a capping layer 32 is deposited. Capping layer 32, in a preferred embodiment is nBLOK, but can be any dielectric layer which inhibits copper diffusion.

Figure 6:
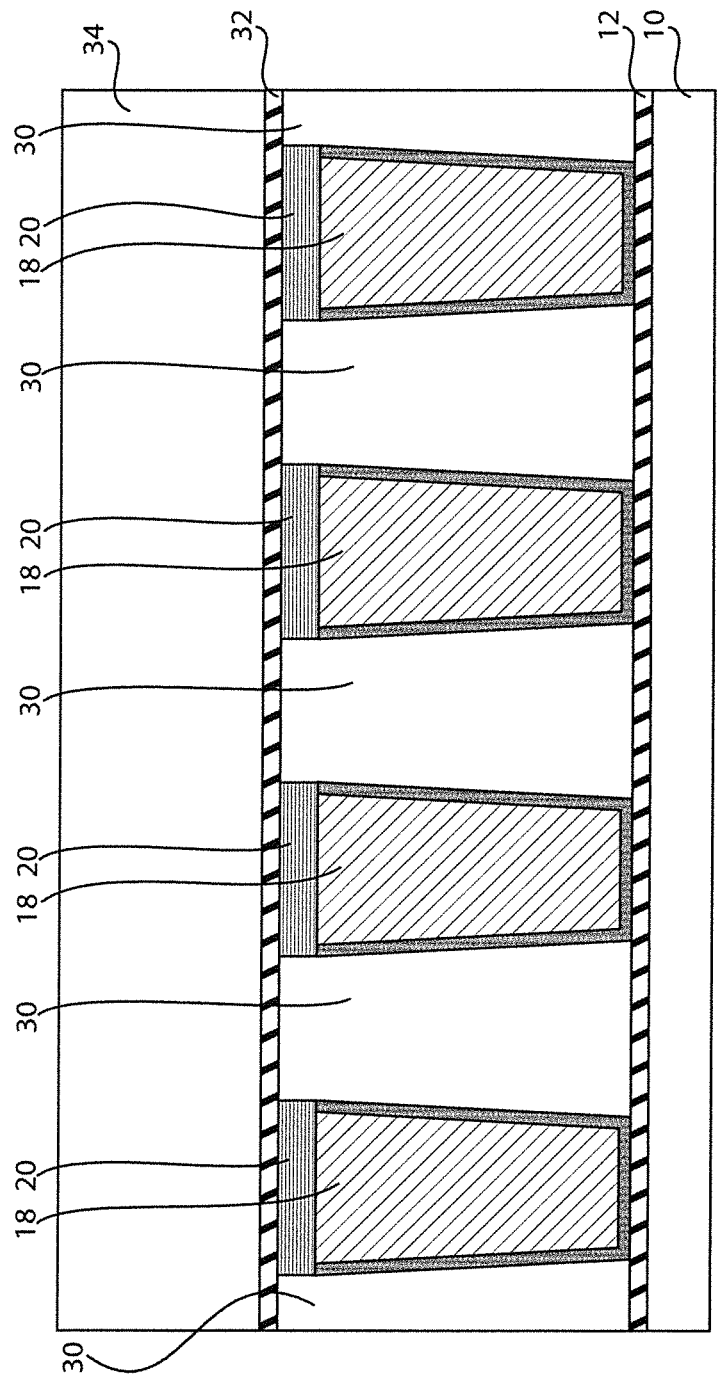
FIG. 6 is a cross-sectional view of the semiconductor structure of FIG. 5 where a ULK layer is deposited over the nBLOK cap layer, in accordance with an embodiment of the present invention.

FIG. 6 is a cross-sectional view of the semiconductor structure of FIG. 5 where a ULK layer is deposited over the nBLOK cap layer, in accordance with an embodiment of the present invention.

In various example embodiments, a ULK layer 34 is deposited over and in direct contact with the nBLOK capping layer 32.

Figure 7:
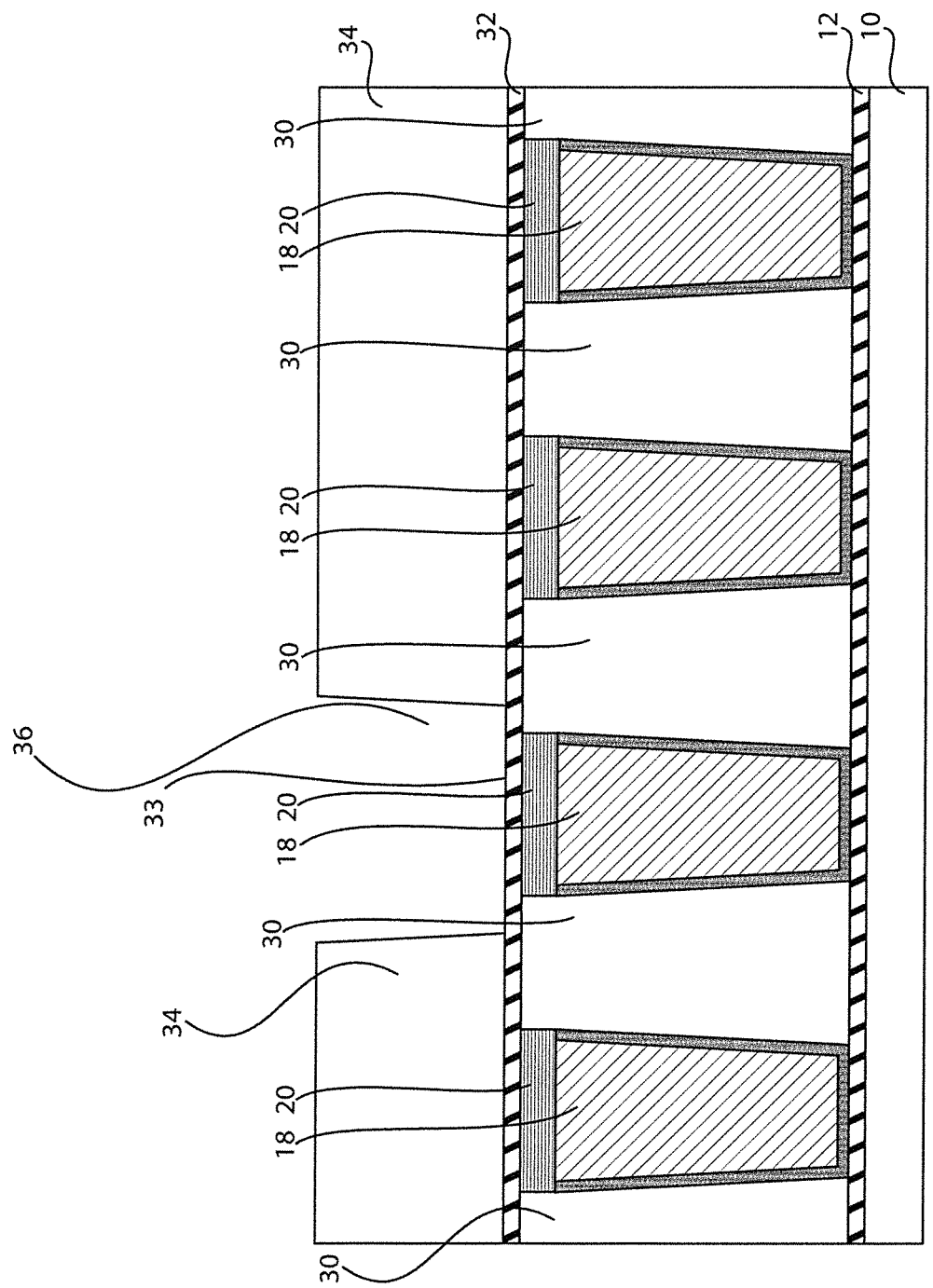
FIG. 7 is a cross-sectional view of the semiconductor structure of FIG. 6 where a via is formed to the top surface of a portion of the nBLOK layer, in accordance with an embodiment of the present invention.

FIG. 7 is a cross-sectional view of the semiconductor structure of FIG. 6 where a via is formed to the top surface of a portion of the nBLOK layer, in accordance with an embodiment of the present invention.

In various example embodiments, a via 36 is formed in the ULK layer 34 such that a top surface 33 of a portion of the nBLOK capping layer 32 is exposed. The via is aligned with a conductive line 18. The width of the via 36 is larger than the width of the conductive line 18.

Figure 8:
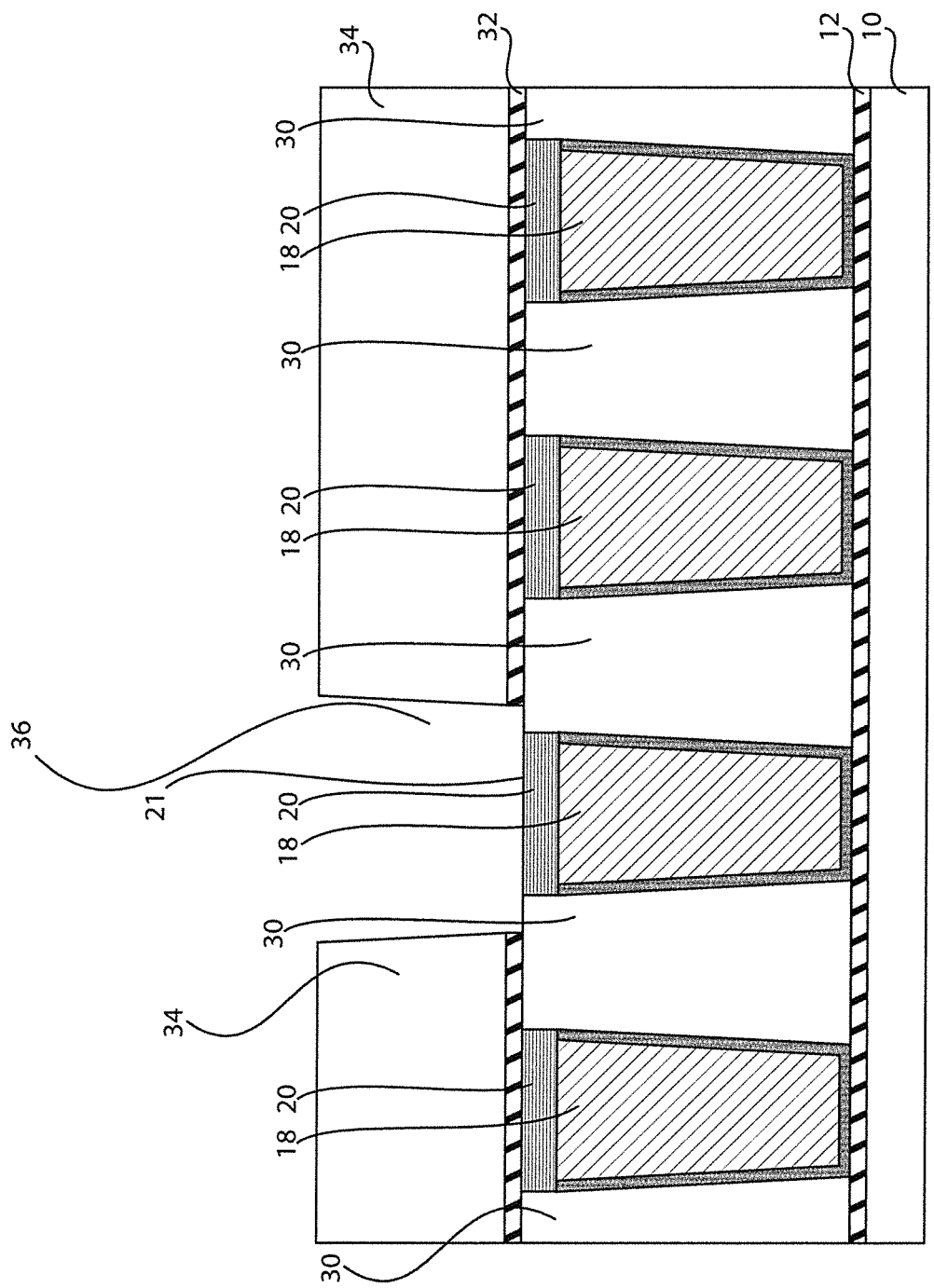
FIG. 8 is a cross-sectional view of the semiconductor structure of FIG. 7 where the exposed portion of the nBLOK layer is etched to expose the first insulating layer, in accordance with an embodiment of the present invention.

FIG. 8 is a cross-sectional view of the semiconductor structure of FIG. 7 where the exposed portion of the nBLOK layer is etched to expose the first insulating layer, in accordance with an embodiment of the present invention.

In various example embodiments, the exposed portion of the nBLOK capping layer 32 is etched to expose a top surface 21 the first insulating layer 20 of the conductive line 18. Thus, the AlN region 20 is removed only on the via contact area. The remaining AlN regions 20 remain intact.

Figure 9:
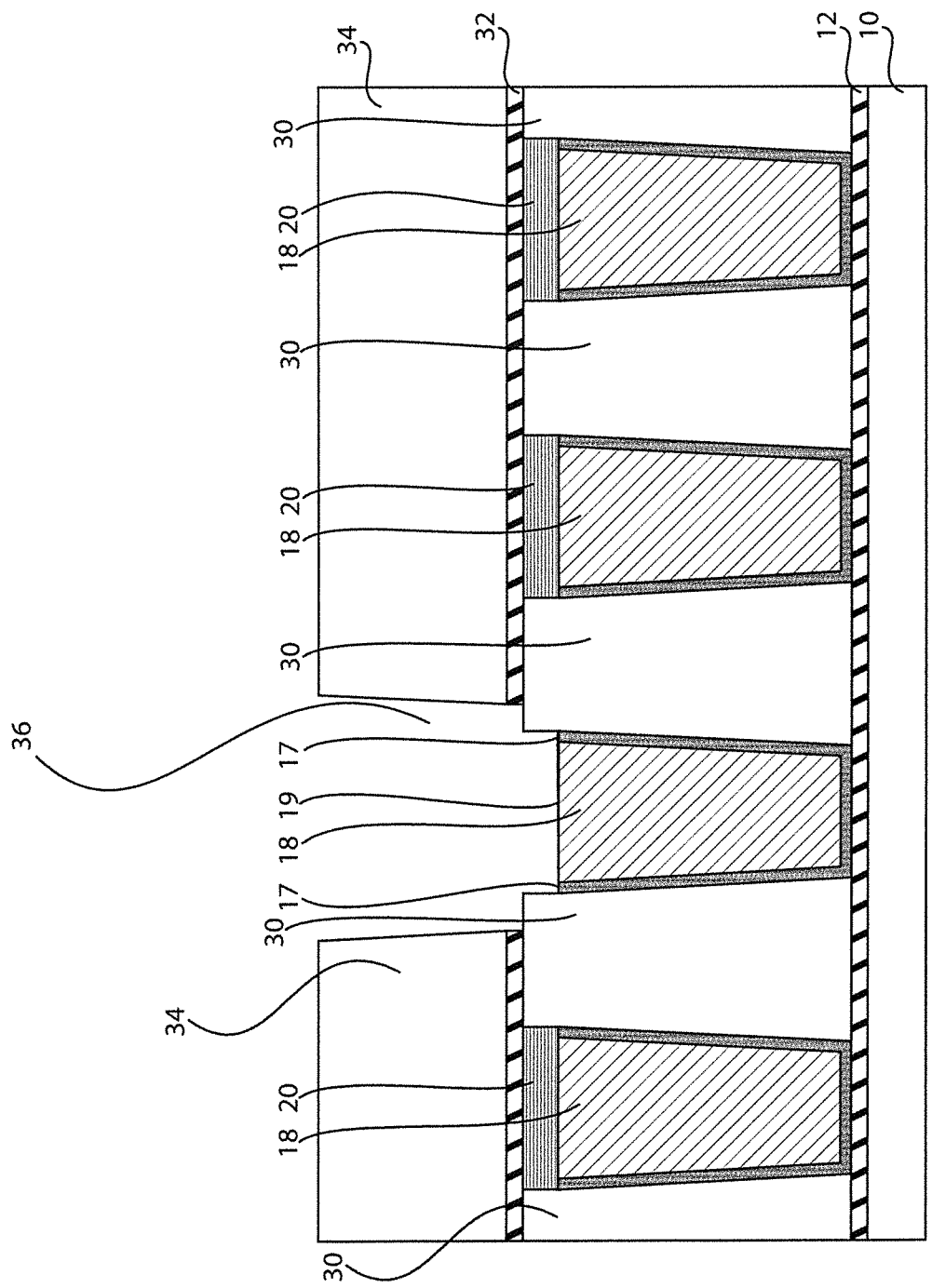
FIG. 9 is a cross-sectional view of the semiconductor structure of FIG. 8 where the exposed first insulating layer is removed to expose a top surface of a conductive line, in accordance with an embodiment of the present invention.

FIG. 9 is a cross-sectional view of the semiconductor structure of FIG. 8 where the exposed first insulating layer is removed to expose a top surface of a conductive line, in accordance with an embodiment of the present invention.

In various example embodiments, the exposed first insulating layer 20 is removed to expose a top surface 19 of the conductive line 18, as well as a top surface 17 of the liner 16. Therefore, the conductive lines 18 are not recessed (or impacted by the semiconductor processing). Instead, selective area deposition of AlN areas 20 on the conductive lines 18 takes place for better uniformity control. This has no negative impact on line resistance.

FIG. 10 is a cross-sectional view of the semiconductor structure of FIG. 9 where a metal fill takes place, the metal fill being planarized, in accordance with an embodiment of the present invention.

In various example embodiments, a dielectric liner 40 and a conductive material 42 can be deposited to complete the structure 50. The minimum dielectric thickness 45 or distance "d" between the via 36 and the adjacent underlying metal lines increases, thus improving reliability.

The metallization can be a single damascene metallization. Thus, only single damascene metallization is needed for the trench, thus enabling dynamic reflow or other fill techniques that are sensitive to pattern and profile needs. The conductive material 42 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 42 can be reduced by chemical-mechanical polishing (CMP) and/or etching. Therefore, the planarization process can be provided by CMP. Other planarization process can include grinding and polishing.

In summary, the exemplary embodiments of the present invention introduce a method and structure for depositing AlN on Cu interconnect features and AlNO on the ILD surfaces of a copper damascene line structure, removing the AlNO selective to AlN forming AlN caped Cu lines, coating and planarizing a ULK ILD, depositing an nBLOK capping layer and the next level ULK ILD layer, patterning and etching a line trench and then a via in the ULK etching through the nBLOK capping layer, selectively removing the AlN to result in a via bottom opening fully aligned and confined on the Cu line feature below, and metallizing and planarizing to complete the line/FAV damascene structure.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}(\Omega\text{-m})^{-1}$.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for achieving fully aligned via formation without metal line recess (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming fully aligned vias without recessing a plurality of conductive lines, the method comprising:
    forming the plurality of conductive lines within an inter-layer dielectric (ILD);
    growing first dielectric regions, defining discontinuous segments, in direct contact with the plurality of conductive lines;
    forming a capping layer over the first dielectric regions;
    depositing an ultra-low-k (ULK) layer over and in direct contact with the capping layer;
    forming a via over a conductive line of the plurality of conductive lines; and
    removing an exposed portion of the capping layer and an exposed first dielectric region in direct contact with the conductive line to reveal the conductive line.

2. The method of claim 1, further comprising filling the via with a conductive material.

3. The method of claim 1, wherein the first dielectric regions are aluminum nitride (AlN) growth regions.

4. The method of claim 1, further comprising growing second dielectric regions in direct contact with the ILD before forming the capping layer.

5. The method of claim 4, wherein the second dielectric regions are aluminum oxynitride (AlNO) regions.

6. The method of claim 5, wherein a height of the first dielectric regions is greater than a height of the second dielectric regions.

7. The method of claim 1, wherein a minimum dielectric thickness between the via and adjacent underlying conductive lines is increased.

8. The method of claim 1, wherein the capping layer directly contacts each of the first dielectric regions.

9. The method of claim 1, wherein the plurality of conductive lines are copper (Cu) lines.

10. A method for forming fully aligned vias without recessing a plurality of copper (Cu) lines, the method comprising:
    depositing aluminum nitride (AlN) on the plurality of Cu lines;
    depositing aluminum oxynitride (AlNO) on inter-layer dielectric (ILD) surfaces of a Cu damascene line structure;
    removing the AlON selective to the AlN to form AlN capped Cu lines;
    coating and planarizing a first ultra-low-k (ULK) ILD layer;
    depositing a capping layer and a second ULK ILD layer;
    patterning a via in the second ULK ILD layer;
    etching through the capping layer; and selectively removing an exposed AlN resulting in a via bottom opening fully aligned and confined on the Cu line below.

11. The method of claim 10, further comprising metallizing and planarizing to complete a line/fully aligned via damascene structure.

12. The method of claim 10, wherein a height of the AlN is greater than a height of the AlNO.

13. The method of claim 10, wherein a minimum dielectric thickness between the via and adjacent underlying conductive lines is increased.

14. The method of claim 10, wherein the capping layer directly contacts each of the AlN capped Cu lines.

15. The method of claim 10, wherein the AlNO is removed faster than AlN by using hydrogen fluoride (HF).

16. The method of claim 10, wherein a height of the AlN is approximately equal to a height of the second ULK ILD layer.

17. A semiconductor structure for forming fully aligned vias without recessing a plurality of conductive lines, the semiconductor structure comprising:
the plurality of conductive lines disposed within an interlayer dielectric (ILD);
first dielectric regions, defining discontinuous segments, disposed in direct contact with one or more of the plurality of conductive lines;
a capping layer in direct contact with the first dielectric regions;
an ultra-low-k (ULK) layer disposed over and in direct contact with the capping layer;
a via disposed over a conductive line of the plurality of conductive lines, the via formed without recessing the conductive line; and
a conductive material disposed within the via.

18. The semiconductor structure of claim 17, wherein the first dielectric regions are aluminum nitride (AlN) growth regions.

19. The semiconductor structure of claim 17, wherein a minimum dielectric thickness between the via and adjacent underlying conductive lines is increased.

20. The semiconductor structure of claim 17, wherein the plurality of conductive lines are copper (Cu) lines and the conductive material is Cu.

* * * * *